(12) United States Patent
Huang et al.

(10) Patent No.: US 11,955,154 B2
(45) Date of Patent: Apr. 9, 2024

(54) SENSE AMPLIFIER CIRCUIT WITH TEMPERATURE COMPENSATION

(71) Applicant: UNITED MICROELECTRONICS CORP., Hsin-Chu (TW)

(72) Inventors: Cheng-Tung Huang, Kaohsiung (TW); Jen-Yu Wang, Tainan (TW); Po-Chun Yang, Tainan (TW); Yi-Ting Wu, Tainan (TW); Yung-Ching Hsieh, Tainan (TW); Jian-Jhong Chen, Tainan (TW); Chia-Wei Lee, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 123 days.

(21) Appl. No.: 17/744,746

(22) Filed: May 16, 2022

(65) Prior Publication Data

US 2023/0343379 A1    Oct. 26, 2023

(30) Foreign Application Priority Data

Apr. 21, 2022  (CN) .......................... 202210425675.5

(51) Int. Cl.
*G11C 7/00* (2006.01)
*G11C 11/16* (2006.01)

(52) U.S. Cl.
CPC ................ *G11C 11/1673* (2013.01)

(58) Field of Classification Search
CPC .................................................. G11C 11/1673

USPC ........................................................... 365/158
See application file for complete search history.

(56) References Cited

U.S. PATENT DOCUMENTS

| | | | |
|---|---|---|---|
| 6,856,108 B2 * | 2/2005 | Kim | B60L 15/2072 318/431 |
| 7,817,465 B2 * | 10/2010 | Oh | G11C 13/004 365/163 |
| 8,050,084 B2 * | 11/2011 | Bae | G11C 13/0004 365/163 |
| 8,228,709 B2 * | 7/2012 | Choi | G11C 8/10 365/207 |
| 8,487,595 B2 | 7/2013 | Popescu | |
| 8,760,939 B2 * | 6/2014 | Taylor | G11C 7/04 365/185.21 |
| 9,183,910 B2 * | 11/2015 | Lee | G11C 11/1675 |
| 11,651,807 B2 * | 5/2023 | Alam | G11C 29/12005 365/158 |
| 11,705,203 B2 * | 7/2023 | Chin | G11C 16/16 365/185.11 |
| 2017/0263299 A1 * | 9/2017 | Takizawa | G11C 11/1673 |

* cited by examiner

*Primary Examiner* — Viet Q Nguyen
(74) *Attorney, Agent, or Firm* — Winston Hsu

(57) ABSTRACT

A sense amplifier circuit includes a sense amplifier, a switch and a temperature compensation circuit. The temperature compensation circuit provides a control signal having a positive temperature coefficient, based on which the switch provides reference impedance for temperature compensation. The sense amplifier includes a first input end coupled to a target bit and a second input end coupled to the switch. The sense amplifier outputs a sense amplifier signal based on the reference impedance and the impedance of the target bit.

10 Claims, 4 Drawing Sheets

SENSE AMPLIFIER CIRCUIT WITH TEMPERATURE COMPENSATION

BACKGROUND OF THE INVENTION

1. Field of the Invention

The present invention is related to a sense amplifier circuit with temperature compensation, and more particularly, to a sense amplifier circuit for use in MRAM and with temperature compensation.

2. Description of the Prior Art

Traditional memory normally stores data by charging/discharging capacitors, while magnetoresistive random-access memory (MRAM) stores data in magnetic domains. MRAM is characterized in high-speed data transmission, high cell density, light weight, low power consumption and high impact resistance, and thus particularly suitable for implementing on high-end portable electronic products.

FIG. 1 is a diagram illustrating a prior art MRAM array using spin-torque-transfer (STT) technique. The MRAM array includes a plurality of MRAM cells 10, a plurality of word lines WL1-WLm, a plurality of sensing word lines SWL1-SWLm, a plurality of bit lines BL1-BLn, and a plurality of sense amplifiers SA1-SAn. Each MRAM cell 10 includes a select transistor 12 and a magnetic tunnel junction (MTJ) transistor 14. Each select transistor 12 includes a first end coupled to a corresponding bit line, a second end coupled to a corresponding MTJ transistor 14, and a control end coupled to a corresponding word line. Each MTJ transistor 14 includes a first end coupled to a corresponding bit line and a second end coupled to the second end of a corresponding select transistor 12. Each MTJ transistor 14 includes a data ferromagnetic layer, a reference ferromagnetic layer, and a tunnel barrier layer. By applying an appropriate switching pulse via a corresponding bit line during the write operation, the magnetization direction of the data ferromagnetic layer may be varied so that the resistance of the MTJ transistor 14 may be switched between logic "0" state and logic "1" state, thereby storing bit information.

When the magnetization direction of the data ferromagnetic layer is aligned in an anti-parallel direction with respect to the magnetization direction of the reference ferromagnetic layer in the MTJ transistor 14, the tunnel barrier layer has high impedance $R_H$, thereby putting the MTJ transistor 14 in an OFF state for storing logic "1" data. When the magnetization direction of the data ferromagnetic layer is aligned in a parallel direction with respect to the magnetization direction of the reference ferromagnetic layer in the MTJ transistor 14, the tunnel barrier layer has low impedance $R_L$, thereby putting the MTJ transistor 14 in an ON state for storing logic "0" data. The impedance of the MTJ transistor 14 has a negative temperature coefficient, which means which means the high impedance $R_H$ and the low impedance $R_L$ of different states decrease as the temperature increases.

During the read operation, the select transistor 12 of a specific MRAM cell 10 is conducting so that the bit information stored in the corresponding MTJ transistor 14 may be transmitted to a corresponding bit line. The sense amplifiers SA1-SAn are respectively coupled to the bit lines BL1-BLn for receiving an activation signal SEN and respectively receiving a plurality of reference voltages REF1-REFn. Each sense amplifier is configured to amplify the current of a corresponding bit line in response to the activation signal SEN and determine the logic state of the MTJ transistor 14 of the corresponding MRAM cell 10 based on a corresponding reference voltage and the current flowing through a corresponding bit line, thereby outputting the corresponding sense amplifier signals SA_OUT1-SA_OUTn.

Each of the prior art sense amplifiers SA1-SAn includes four reference MTJ transistors 24, wherein two reference MTJ transistors are set in the ON state and the other two reference MTJ transistors are set in the OFF state for providing reference impedance Rref whose value is equal to $(R_H+R_L)/2$. Due to process or material variations, different reference MTJ transistors may have different switching characteristics and thus different reference impedance Rref, which prevent the sense amplifiers from sensing the data stored in the MRAM cells accurately.

SUMMARY OF THE INVENTION

The present invention provides a sense amplifier circuit with temperature compensation. The sense amplifier circuit includes a sense amplifier, a switch and a temperature compensation circuit. The sense amplifier includes a first input end coupled to a target bit having high impedance in a first state and having low impedance in a second state, a second input end and an output end, wherein the high impedance has a first temperature coefficient and the low impedance has a second temperature coefficient. The switch is configured to operate according to a first control signal for providing reference impedance having a third temperature coefficient, and includes a first end coupled to the second input end of the sense amplifier, a second end and a control end for receiving the first control signal. The temperature compensation circuit is coupled to the control end of the first switch and configured to provide the first control signal having a fourth temperature coefficient. The first temperature coefficient, the second temperature coefficient and the third temperature coefficient have a same polarity. The fourth temperature coefficient and the first temperature coefficient have opposite polarities.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
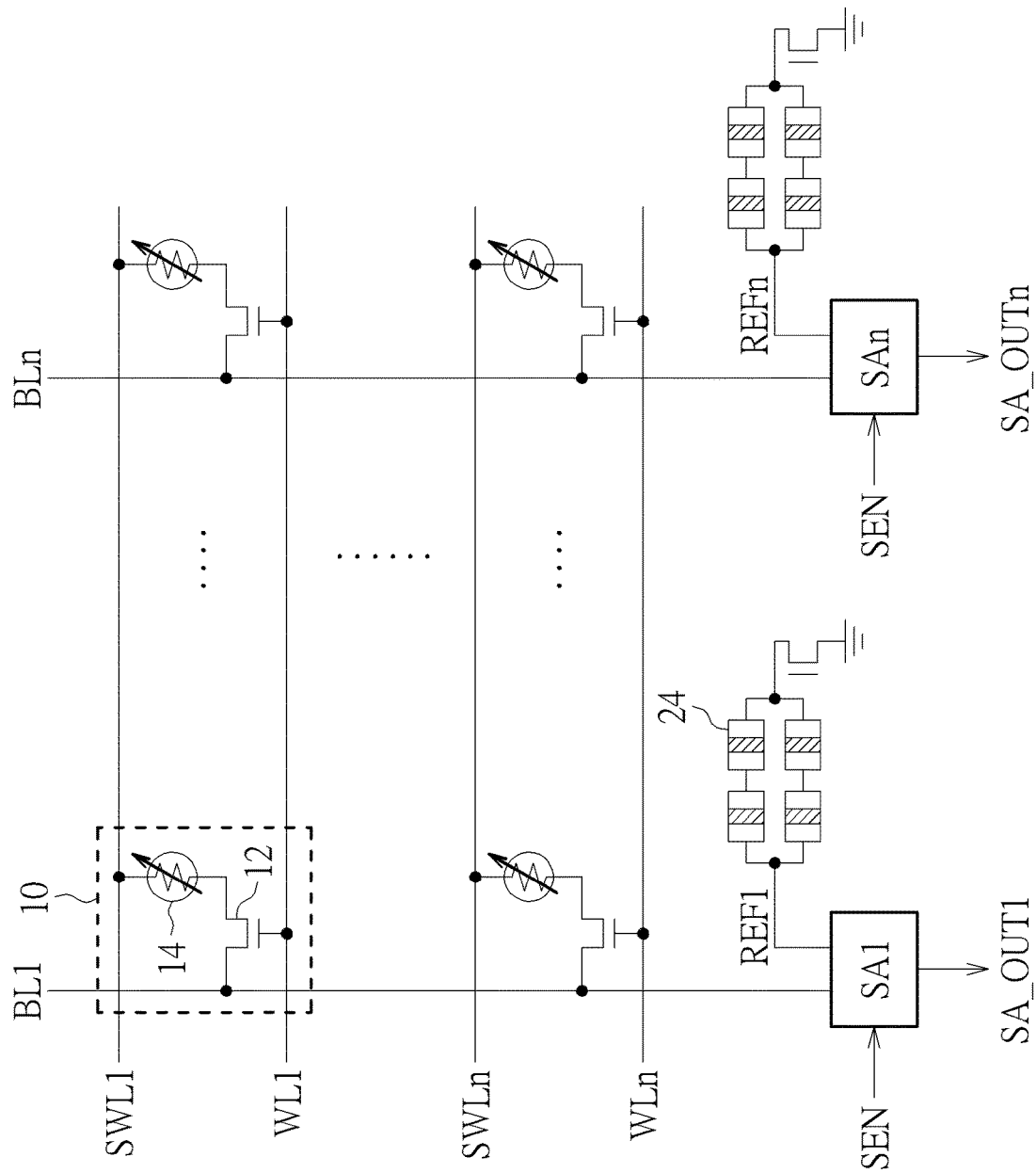
FIG. 1 is a diagram illustrating a prior art MRAM array using spin-torque-transfer technique.
Figure 2:
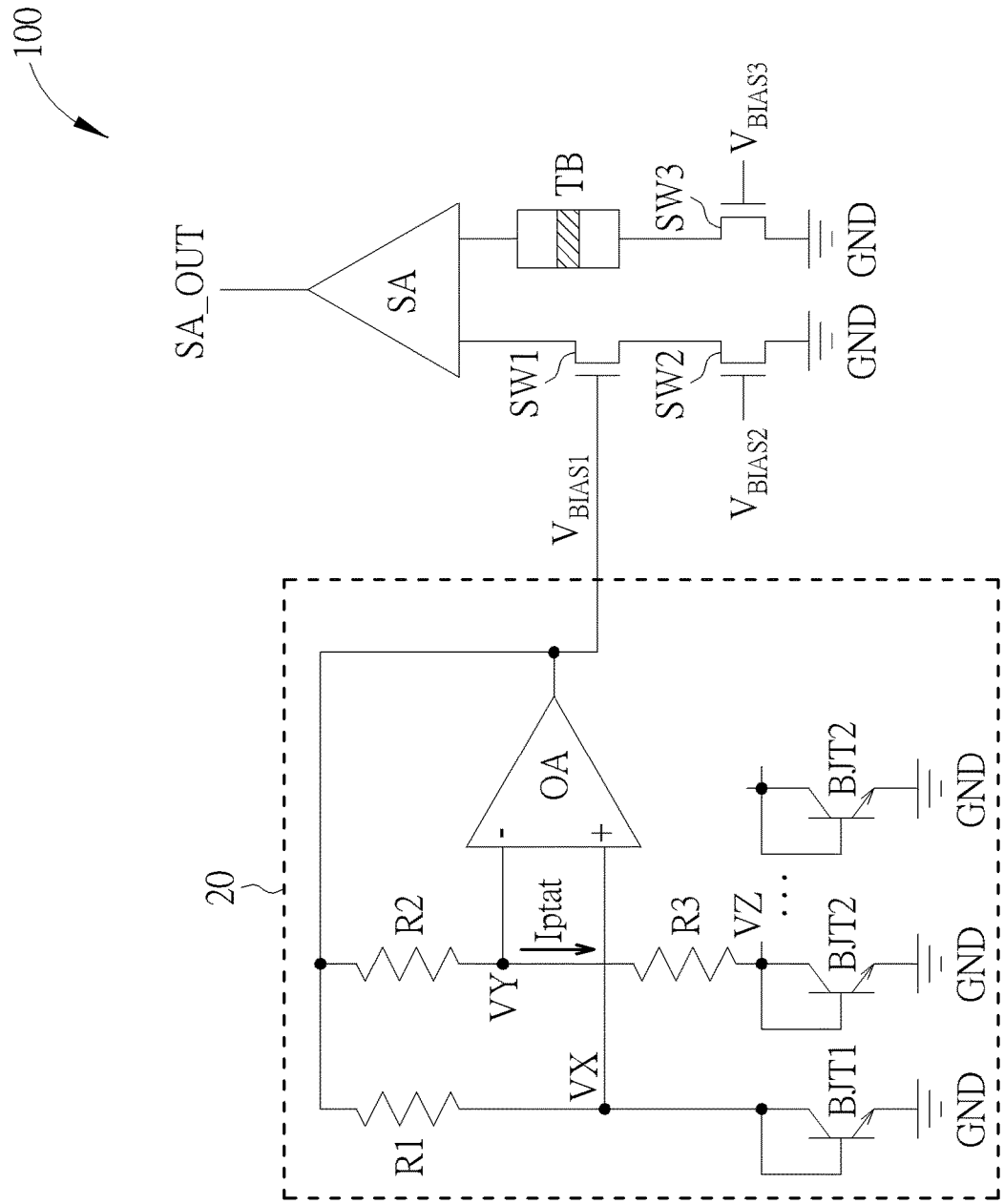
FIG. 2 is diagram illustrating a sense amplifier circuit according to an embodiment of the present invention.

FIG. 2 is diagram illustrating a sense amplifier circuit 100 according to an embodiment of the present invention. The sense amplifier circuit 100 includes a sense amplifier SA, switches SW1-SW3 and a temperature compensation circuit 20.

The sense amplifier SA includes a first input end coupled to a target bit TB, a second input end coupled to the switch SW1, and an output end for outputting a sense amplifier signal SA_OUT. The target bit may be an MTJ transistor of an MRAM cell which has high impedance $R_H$ in the OFF state and low impedance $R_L$ in the ON state. The impedance of the target bit TB has a negative temperature coefficient, which means the high impedance $R_H$ and the low impedance $R_L$ of different states decrease as the temperature increases.

The switch SW1 includes a first end coupled to the second input end of the sense amplifier SA, a second end coupled to the switch SW2, and a control end for receiving a first control signal $V_{BIAS1}$ The switch SW1 is configured to provide reference impedance Rref having a negative temperature coefficient according to the first control signal $V_{BIAS1}$. The switch SW2 includes a first end coupled to the second end of the switch SW1, a second end coupled to a ground voltage GND, and a control end for receiving a second control signal $V_{BIAS2}$. The switch SW3 includes a first end coupled to the target bit TB, a second end coupled to the ground voltage GND, and a control end for receiving a third control signal $V_{BIAS3}$.

In an embodiment of the present invention, the switches SW1-SW3 may be metal-oxide-semiconductor field-effect transistors (MOSFETs). Compared to the MTJ transistors adopted in the prior art, the characteristic of the switch SW1 is relatively insensitive to process variations. The switch SW1 can provide the reference impedance Rref having a negative temperature coefficient when operating according to the first control signal $V_{BIAS1}$ which can reflect temperature variations.

In an embodiment of the present invention, the temperature compensation circuit 20 includes an operational amplifier OA, resistors R1-R3, a first transistor BJT1 and N second transistors BJT2, wherein N is an integer larger than 1. The first end of the first transistor BJT1 is coupled to the first input end (positive input end) of the operational amplifier OA, and the second end and the control end of the first transistor BJT1 are coupled to the ground voltages GND. The first end of each second transistor BJT2 is coupled to the second input end (negative input end) of the operational amplifier OA via the resistor R3, and the second end and the control end of each second transistor BJT2 are coupled to the ground voltages GND, wherein VZ represents the voltage established on the second end of the second transistor BJT2. The resistor R1 includes a first end coupled to the first input end of the operational amplifier OA and a second end coupled to the output end of the operational amplifier OA. The resistor R2 includes a first end coupled to the second input end of the operational amplifier OA and a second end coupled to the output end of the operational amplifier OA. The operational amplifier OA is configured to provide the first control signal $V_{BIAS1}$ according a voltage VX established on its first input end and a voltage VY established on its second input end.

In an embodiment of the present invention, the first transistor BJT1 and the second transistor BJT2 may be bipolar junction transistors (BJTs) each having a collector (first end), an emitter (second end) and a base (control end). Since the collector and the base of the first transistor BJT1 are coupled to each other, the voltage established across the first transistor BJT1 is equal to its base-emitter voltage $V_{BE1}$. Since the collector and the base of the second transistor BJT2 are coupled to each other, the voltage established across the second transistor BJT2 is equal to its base-emitter voltage $V_{BE2}$.

Due to the virtual short characteristic of the operational amplifier OA, its first input end and its second input end are kept at the same voltage level, which results in $VX=VY=V_{BE1}$. On the other hand, the voltage VZ established on the second end of the second transistor BJT2 is equal to $V_{BE2}$. The voltage difference (VY−VZ) established across the resistor R3 results in current Iptat having a positive temperature coefficient. The value of the current Iptat may be represented by the following equation (1), wherein $V_T$ represents thermal voltage and n represents the area ratio of the second transistors BJT2 to the first transistor BJT1.

$$\text{Iptat}=(VY-VZ)/R3=(V_{BE1}-V_{BE2})/R3=V_T*\text{Ln}(n) \tag{1}$$

The value of the first control signal $V_{BIAS1}$ outputted by the temperature compensation circuit 20 may be represented by the following equation (2). The variation of the first control signal $V_{BIAS1}$ with time may be represented by the following equation (3)

$$V_{BIAS1}=V_{BE2}+V_T*\text{Ln}(n)*(1+R1/R2) \tag{2}$$

$$\partial V_{BIAS1}/\partial T=\partial V_{BE2}/\partial T+(\partial V_T/\partial_T) \tag{3}$$

Figure 4:
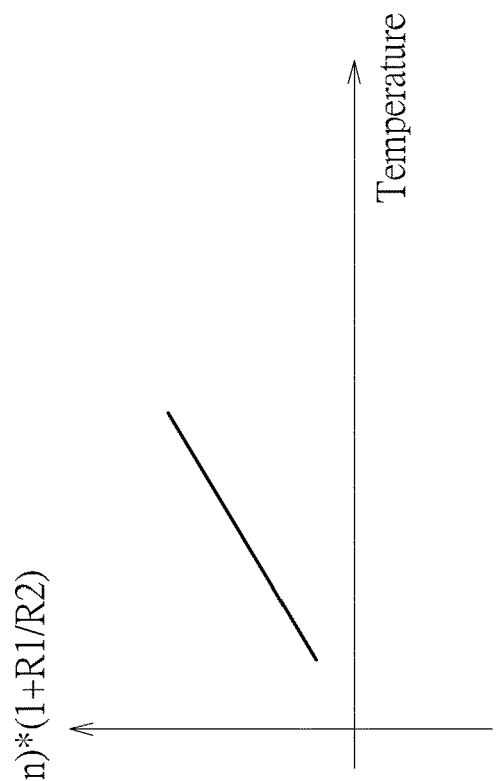
FIG. 4 is diagram illustrating the time-varying characteristic of the value of $V_T*Ln(n)*(1+R1/R2)$ according to an embodiment of the present invention.
Figure 3:
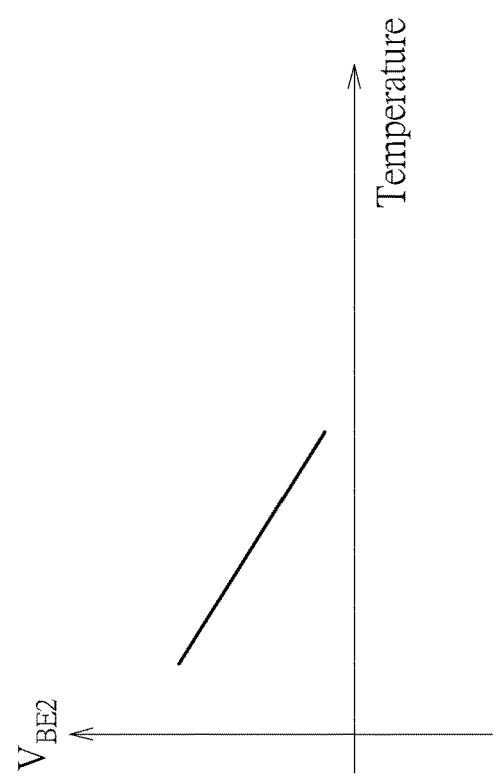
FIG. 3 is diagram illustrating the time-varying characteristic of the voltage established across the second transistor according to an embodiment of the present invention.

FIG. 3 is diagram illustrating the time-varying characteristic of the voltage $V_{BE2}$ established across the second transistor BJT2 according to an embodiment of the present invention. FIG. 4 is diagram illustrating the time-varying characteristic of the value of $V_T*\text{Ln}(n)*(1+R1/R2)$ in equation (2) according to an embodiment of the present invention. As well-known to those skilled in the art, the base-emitter voltage of a BJT has a negative temperature coefficient, and the thermal voltage $V_T$ has a positive temperature coefficient.

As depicted in FIG. 3, FIG. 4 and equation (2), the value of the first control signal $V_{BIAS1}$ is determined by the voltage $V_{BE2}$ having a negative temperature coefficient and $V_T*\text{Ln}(n)*(1+R1/R2)$ having a positive temperature coefficient. By adequately selecting the number N of the transistors BJT2 (which adjusts the area ratio of the second transistors BJT2 to the first transistor BJT1) and the values of the resistors R2-R3, $(\partial V_{BIAS1}/\partial_T)$ in equation (3) may be set to 0 so that the first control signal $V_{BIAS1}$ can have a positive temperature coefficient, as depicted in FIG. 5.

Figures 5, 6:
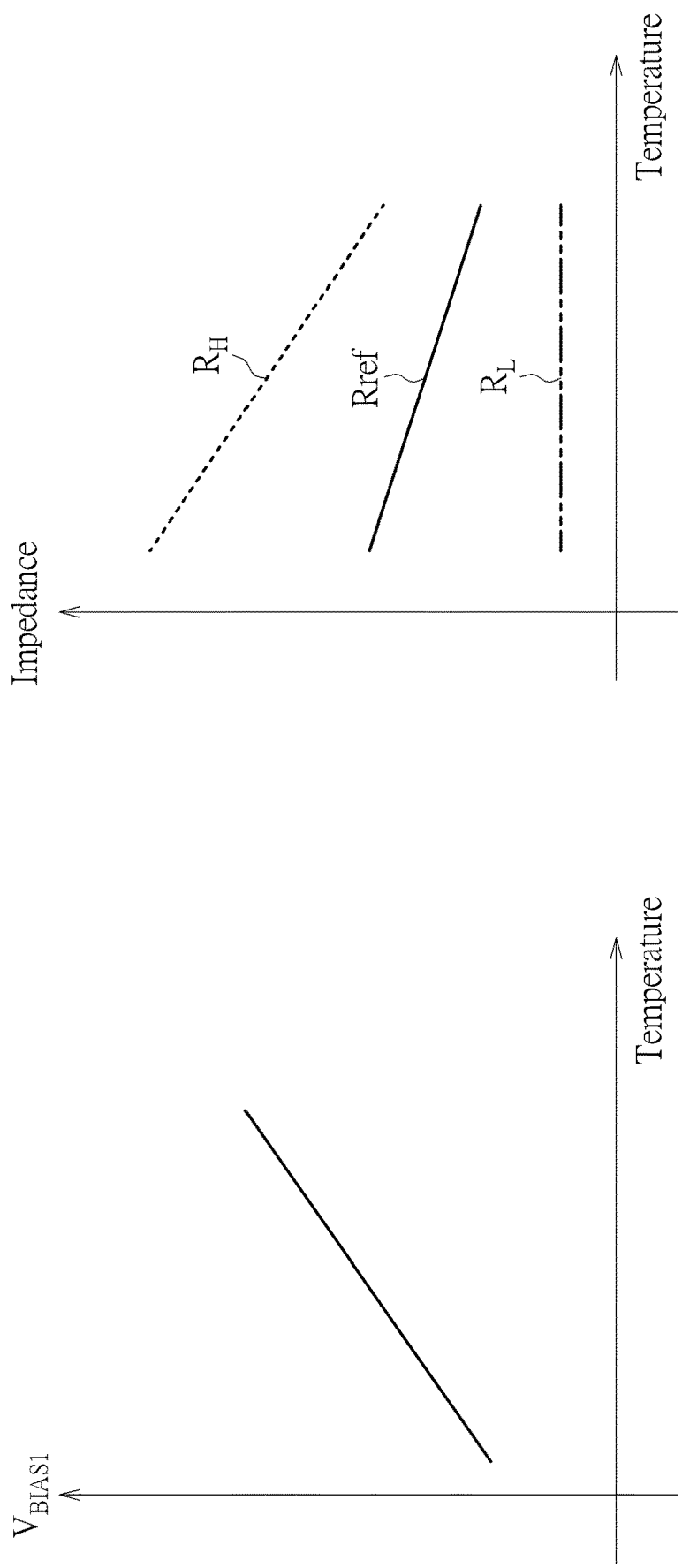
FIG. 5 is diagram illustrating the time-varying characteristic of the first control signal according to an embodiment of the present invention.
FIG. 6 is diagram illustrating the time-varying characteristic of the reference impedance provided by the switch, the high impedance of the target bit and the low impedance of the target bit according to an embodiment of the present invention.

FIG. 6 is diagram illustrating the time-varying characteristic of the reference impedance Rref provided by the switch SW1, the high impedance $R_H$ of the target bit TB and the low impedance $R_L$ of the target bit TB according to an embodiment of the present invention. By adjusting the value of R2/R3 and the value of $V_{BE2}$, the value of the reference impedance Rref may be between the high impedance $R_H$ and the low impedance $R_L$ at any temperature.

In the present invention, the temperature compensation circuit 20 may adopt any type of bandgap reference circuit capable of providing the first control signal $V_{BIAS1}$ having a positive temperature coefficient. However, the implementation of the temperature compensation circuit 20 does not limit the scope of the present invention.

In conclusion, the present invention adopts the switch SW1 whose characteristic is relatively insensitive to process variations for providing the reference impedance Rref, and adopts the temperature compensation circuit 20 for providing the first control signal $V_{BIAS1}$ having a positive temperature coefficient. Therefore, when the switch SW1 operates according to the first control signal $V_{BIAS1}$, the influence of temperature variations on the reference impedance Rref may be compensated, thereby improving the accuracy of the present sense amplifier circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sense amplifier circuit with temperature compensation, comprising:
    a sense amplifier, including:
        a first input end coupled to a target bit having high impedance in a first state and having low impedance in a second state, wherein the high impedance has a first temperature coefficient and the low impedance has a second temperature coefficient;
        a second input end; and
        an output end;
    a first switch configured to operate according to a first control signal for providing reference impedance having a third temperature coefficient, and including:
        a first end coupled to the second input end of the sense amplifier;
        a second end; and
        a control end for receiving the first control signal; and
    a temperature compensation circuit coupled to the control end of the first switch and configured to provide the first control signal having a fourth temperature coefficient, wherein the first temperature coefficient, the second temperature coefficient and the third temperature coefficient have a same polarity, and the fourth temperature coefficient and the first temperature coefficient have opposite polarities.

2. The sense amplifier circuit of claim 1, wherein the temperature compensation circuit comprises:
    an operational amplifier, including:
        a first input end;
        a second input end; and
        an output end for outputting the first control signal;
    a first resistor, including:
        a first end coupled to the first input end of the operational amplifier; and
        a second end coupled to the output end of the operational amplifier;
    a second resistor, including:
        a first end coupled to the second input end of the operational amplifier; and
        a second end coupled to the output end of the operational amplifier;
    a third resistor, including:
        a first end coupled to the second input end of the operational amplifier; and
        a second end;
    a first transistor, including:
        a first end coupled to the first input end of the operational amplifier;
        a second end coupled to a ground voltage; and
        a control end coupled to the first input end of the operational amplifier; and
    a plurality of second transistors each including:
        a first end coupled to the second end of the third resistor;
        a second end coupled to the ground voltage; and
        a control end coupled to the second end of the third resistor.

3. The sense amplifier circuit of claim 2, wherein the first transistor and the plurality of second transistors are bipolar junction transistors (BJTs).

4. The sense amplifier circuit of claim 2, wherein:
    current flowing through the plurality of second transistors has a fifth temperature coefficient;
    a voltage difference between the control end and the second end of each second transistor has a sixth temperature coefficient;
    the fourth temperature coefficient and the fifth temperature coefficient have a same polarity; and
    the fifth temperature coefficient and the sixth temperature coefficient have opposite polarities.

5. The sense amplifier circuit of claim 4, wherein a value of the second resistor, a value of the third resistor and the voltage difference between the control end and the second end of each second transistor are set so that a value of the reference impedance provided by the first switch is between the high impedance of the target bit and the low impedance of the target bit at any temperature.

6. The sense amplifier circuit of claim 4, wherein a number of the plurality of second transistors and the voltage difference between the control end and the second end of each second transistor are set so that a value of the reference impedance provided by the first switch is between the high impedance of the target bit and the low impedance of the target bit at any temperature.

7. The sense amplifier circuit of claim 1, further comprising:
    a second switch, including:
        a first end coupled to the second end of the first switch;
        a second end coupled to a ground voltage; and
        a control end for receiving a second control signal; and
    a third switch, including:
        a first end coupled to the target bit;
        a second end coupled to the ground voltage; and
        a control end for receiving a third control signal.

8. The sense amplifier circuit of claim 1, wherein the first switch is a metal-oxide-semiconductor field-effect transistor (MOSFET).

9. The sense amplifier circuit of claim 1, wherein the first temperature coefficient, the second temperature coefficient and the third temperature coefficient are negative temperature coefficients.

10. The sense amplifier circuit of claim 1, wherein the target bit is a magnetoresistive random-access memory (MRAM) bit.

* * * * *